US011664801B1

(12) United States Patent
Finck

(10) Patent No.: US 11,664,801 B1
(45) Date of Patent: May 30, 2023

(54) MULTI-QUBIT ARCHITECTURES WITH MODE-SELECTIVE CHARGE COUPLING BETWEEN NOVEL FLUXONIUM-MOLECULE QUBITS

(71) Applicant: INTERNATIONAL BUSINESS MACHINES CORPORATION, Armonk, NY (US)

(72) Inventor: Aaron Finck, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/545,989

(22) Filed: Dec. 8, 2021

(51) Int. Cl.
*H03K 17/92* (2006.01)
*G06N 10/40* (2022.01)
*H01L 39/22* (2006.01)

(52) U.S. Cl.
CPC ............. *H03K 17/92* (2013.01); *G06N 10/40* (2022.01); *H01L 39/223* (2013.01)

(58) Field of Classification Search
CPC ...................................................... H03K 17/92
USPC ........................................................ 327/528
See application file for complete search history.

(56) References Cited

U.S. PATENT DOCUMENTS

| 10,056,908 B2 | 8/2018 | Rigetti et al. |
| 10,192,168 B2 | 1/2019 | Rigetti et al. |
| 10,424,711 B2 | 9/2019 | Schoelkopf, III et al. |
| 10,424,712 B2 | 9/2019 | Schoelkopf, III et al. |
| 10,572,816 B1 | 2/2020 | Vavilov et al. |
| 10,740,688 B2 | 8/2020 | Selvanayagam et al. |
| 10,840,295 B2 | 11/2020 | Sandberg et al. |
| 11,070,210 B2 | 7/2021 | Reagor et al. |

FOREIGN PATENT DOCUMENTS

| WO | 2020150348 A1 | 7/2020 |
| WO | 2021102321 A2 | 5/2021 |
| WO | 2021168019 A1 | 8/2021 |

OTHER PUBLICATIONS

Finck, et al., "Suppressed crosstalk between two-junction superconducting qubits with mode-selective exchange coupling", May 26, 2021. (Year: 2021).*
Cross, A. W et al., "Optimized Pulse Shapes for a Resonator-Induced PHASE Gate"; Physical Review A 91, 032325 (2015); 12 pgs.
Roy, T. et al., "Implementation of Pairwise Longitudinal Coupling in a Three-Qubit Superconducting Circuit" Physical Review Applied 7, 054025 (2017); 15 pgs.
Rebic, S. et al., "Giant Kerr Nonlinearities in Circuit Quantum Electrodynamics"; Physical Review Letters PRL 103, 150503 (2009); 4 pgs.

(Continued)

*Primary Examiner* — Tomi Skibinski
(74) *Attorney, Agent, or Firm* — Intelletek Law Group, PLLC; Gabriel Daniel, Esq.

(57) ABSTRACT

A qubit structure includes a first fluxonium qubit having a first Josephson Junction (JJ) in parallel with a first capacitor and a first superconducting inductor. A second fluxonium qubit includes a second JJ in parallel with a second capacitor and a second superconducting inductor, coupled in series with the first fluxonium qubit. A third capacitor is coupled in parallel to the series first and second fluxonium qubits.

20 Claims, 6 Drawing Sheets

(56) References Cited

OTHER PUBLICATIONS

Gambetta, J. M., et al., "Superconducting Qubit with Purcell Protection and Tunable Coupling"; Physical Review Letters 106, 030502 (2011); 4 pgs.

Srinivasan, S. J. et al., "Tunable Coupling in Circuit Quantum Electrodynamics Using a Superconducting Charge Qubit with a V-Shaped Energy Level Diagram"; Physical Review Letters PRL 106, 083601 (2011); 4 pgs.

Paik, H., et al., "Experimental Demonstration of a Resonator-Induced Phase Gate in a Multiqubit Circuit-QED System"; Physical Review Letters 117, 250502 (2016) 5 pgs.

Kou, A. et al., "Fluxonium-Based Artificial Molecule with a Tunable Magnetic Moment"; Physical Review X 7, 031037 (2017); 8 pgs.

Moskalenko, I. N. et al., "Tunable Coupling Scheme for Implementing Two-Qubit Gates on Fluxonium Qubits", arxiv.org, Cornell University Library, Ithaca, New York, US (2021), 14 pgs.

Nesterov, K. N. et al., "Proposal for Entangling Gates on Fluxonium Qubits Via a Two-Photon Transition", arxiv.org, Cornell University Library, Ithaca, New York, US (2021), 15 pgs.

Nguyen, L. B. et al., "High-Coherence Fluxonium Qubit", Physical Review X (2019), vol. 9:4, 14 pgs.

International Search Report and Written Opinion dated Feb. 21, 2023 in related international application No. PCT/EP2022/084347, 13 pgs.

\* cited by examiner

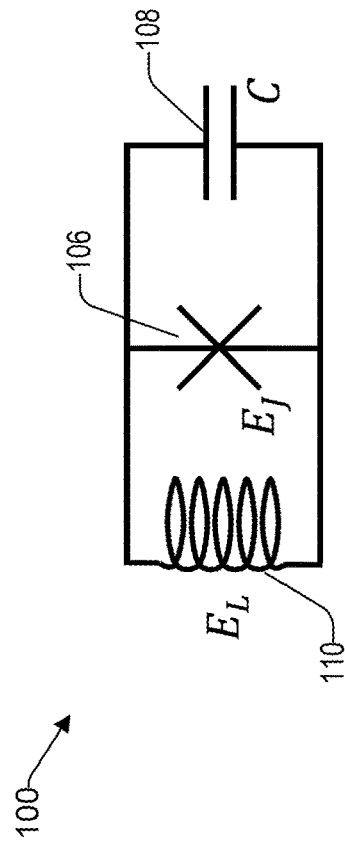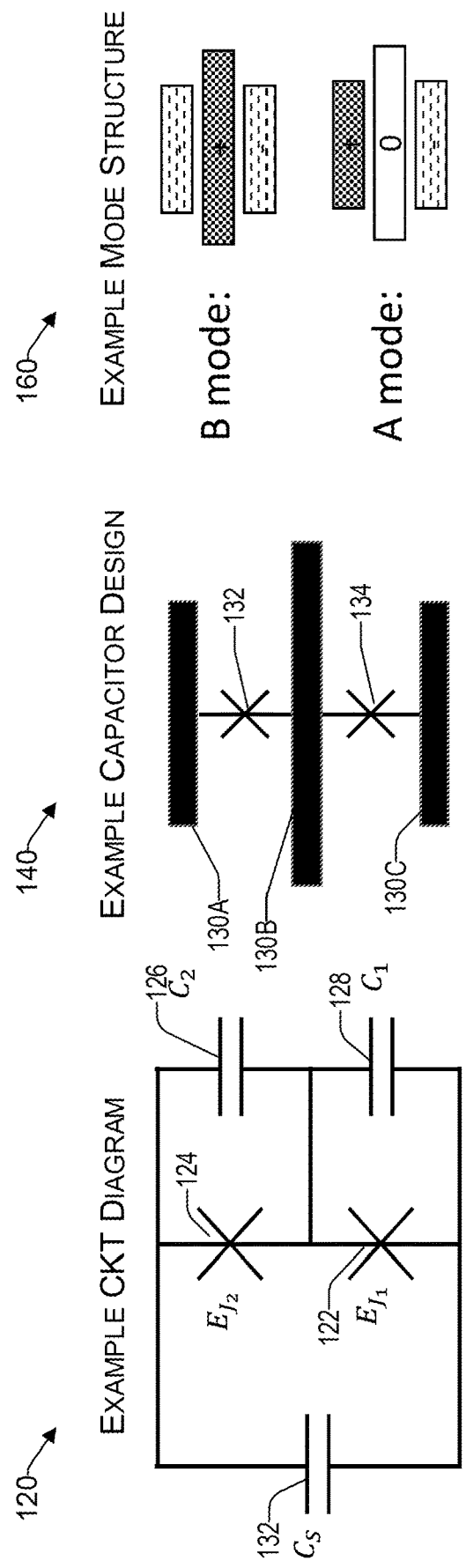

MULTI-QUBIT ARCHITECTURES WITH MODE-SELECTIVE CHARGE COUPLING BETWEEN NOVEL FLUXONIUM-MOLECULE QUBITS

BACKGROUND

Technical Field

The present disclosure generally relates to quantum computing, and more particularly, to superconducting structures and methods of creation thereof.

Background Information

Superconducting quantum computing is an implementation of a quantum computer in superconducting electronic circuits. Quantum computation studies the application of quantum phenomena for information processing and communication. Various models of quantum computation exist, and the most popular models include the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The ability to include more superconducting qubits is salient to being able to realize the potential of quantum computers. However, as the number of such qubits increases, the cross-talk between the qubits can increase the error rate. Although there may be techniques to control cross-talk between superconducting qubits, such structures tend to have lower anharmonicity than other superconducting qubits, which can limit the speed, and thus, fidelity of quantum gates. Various quantum phenomena, such as superposition and entanglement, do not have analogs in the world of classical computing and therefore may involve special structures, techniques, and materials.

SUMMARY

The following summarizes exemplary, non-limiting embodiments. According to one embodiment, a qubit structure includes a first fluxonium qubit that includes a first Josephson Junction (JJ) in parallel with a first capacitor and a first superconducting inductor. A second fluxonium qubit includes a second JJ in parallel with a second capacitor and a second superconducting inductor, coupled in series with the first fluxonium qubit. A third capacitor is coupled in parallel to the series first and second fluxonium qubits.

In one embodiment, the first and second capacitors are each superconductor capacitor pads. A common node at the interface of the series connection between the first fluxonium qubit and the second fluxonium qubit is a middle superconductor capacitor pad. The first and second capacitor pads are capacitively coupled by the third capacitor.

In one embodiment, the capacitive coupling of the third capacitor is configured to cause plasmon-like excitations associated with the first and second fluxonium qubits to hybridize into a bright mode and a dark mode.

In one embodiment, the dark mode is higher in frequency than the bright mode.

In one embodiment, the first fluxonium qubit, the second fluxonium qubit, and the third capacitor create a first difluxonium qubit. The qubit structure further includes a second difluxonium qubit. A bus resonator coupled between the first difluxonium qubit and the second difluxonium qubit.

In one embodiment, the bus resonator has a first node that is capacitively coupled to a middle pad of the first difluxonium qubit. The bus resonator has a second node that is capacitively coupled to a middle pad of the second difluxonium qubit.

In one embodiment, the bus resonator structure is configured to provide a mode-selective charge coupling to suppress cross-talk between qubit modes that are not coupled.

In one embodiment, the first fluxonium qubit and the second fluxonium qubit is implemented by a resonator induced phase (RIP) gate.

In one embodiment, the first fluxonium qubit and the second fluxonium qubit are in separate modes.

In one embodiment, the first and second fluxonium qubits are configured to operate at a zero magnetic field.

In one embodiment, there is a magnetic shield configured to prevent dephasing by a flux noise of the first and second fluxonium qubits.

According to one embodiment, a method of providing a multi-qubit entangling gate includes providing a first fluxonium qubit comprising a first Josephson Junction (JJ) in parallel with a first capacitor and a first superconducting inductor. A second fluxonium qubit comprising a second JJ is provided in parallel with a second capacitor and a second superconducting inductor, coupled in series with the first fluxonium qubit. A third capacitor is coupled in parallel to the series' first and second fluxonium qubits.

In one embodiment, the first and second capacitor pads are capacitively coupled by the third capacitor. A common node at the interface of the series connection between the first fluxonium qubit and the second fluxonium qubit is configured as a middle superconductor capacitor pad. The first and second capacitors are each configured as superconductor capacitor pads.

In one embodiment, plasmon-like excitations associated with the first and second fluxonium qubits are caused to hybridize into a bright mode and a dark mode, by the capacitive coupling.

In one embodiment, the first fluxonium qubit, the second fluxonium qubit, and the third capacitor create a first difluxonium qubit. The method further includes providing a second difluxonium qubit. A bus resonator is coupled between the first difluxonium qubit and the second difluxonium qubit.

In one embodiment, the method further includes capacitively coupling a first node of the bus resonator to a middle pad of the first difluxonium qubit. A second node of the bus resonator is coupled to a middle pad of the second difluxonium qubit.

In one embodiment, a mode-selective charge coupling is provided to suppress cross-talk between qubit modes that are not coupled, by the bus resonator.

In one embodiment, the first fluxonium qubit and the second fluxonium qubit are operated in separate modes.

In one embodiment, the first and second fluxonium qubits are operated at a zero magnetic field.

In one embodiment, dephasing by a flux noise of the first and second fluxonium qubits is prevented via a magnetic shield.

According to one embodiment, a resonator induced phase (RIP) gate includes a first difluxonium qubit, comprising: a first fluxonium qubit comprising a first Josephson Junction (JJ) in parallel with a first capacitor and a first superconducting inductor; a second fluxonium qubit comprising a second JJ in parallel with a second capacitor and a second superconducting inductor, coupled in series with the first fluxonium qubit; and a third capacitor coupled in parallel to the series first and second fluxonium qubits. There is a second difluxonium qubit, comprising: a third fluxonium qubit comprising a third Josephson Junction (JJ) in parallel with a fourth capacitor and a third superconducting inductor; a fourth fluxonium qubit comprising a fourth JJ in parallel with a fifth capacitor and a fourth superconducting inductor, coupled in series with the third fluxonium qubit; and a sixth capacitor coupled in parallel to the series third and fourth fluxonium qubits. There is a bus resonator coupled between the first difluxonium qubit and the second difluxonium qubit.

By virtue of the teachings herein a quantum computing architecture is provided with low cross-talk between qubits and that permits fast, accurate two-qubit entangling gates. The architecture is substantially insensitive to moderate variations in qubit frequency due to imperfectly controlled device parameters (e.g., Josephson junction size). The anharmonicity of the qubits is maximized, thereby allowing the single- and two-qubit gates to be as fast as possible.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1A is an example circuit diagram of a fluxonium qubit, consistent with an illustrative embodiment.

FIG. 1B is an example circuit diagram of a tunable-coupling qubit.

FIG. 1C is an example capacitor design representing the first capacitor and the second capacitor of FIG. 1B, consistent with an illustrative embodiment.

FIG. 1D is an example mode structure of a tunable-coupling qubit consistent with an illustrative embodiment.

DETAILED DESCRIPTION

Overview

Figure 2:
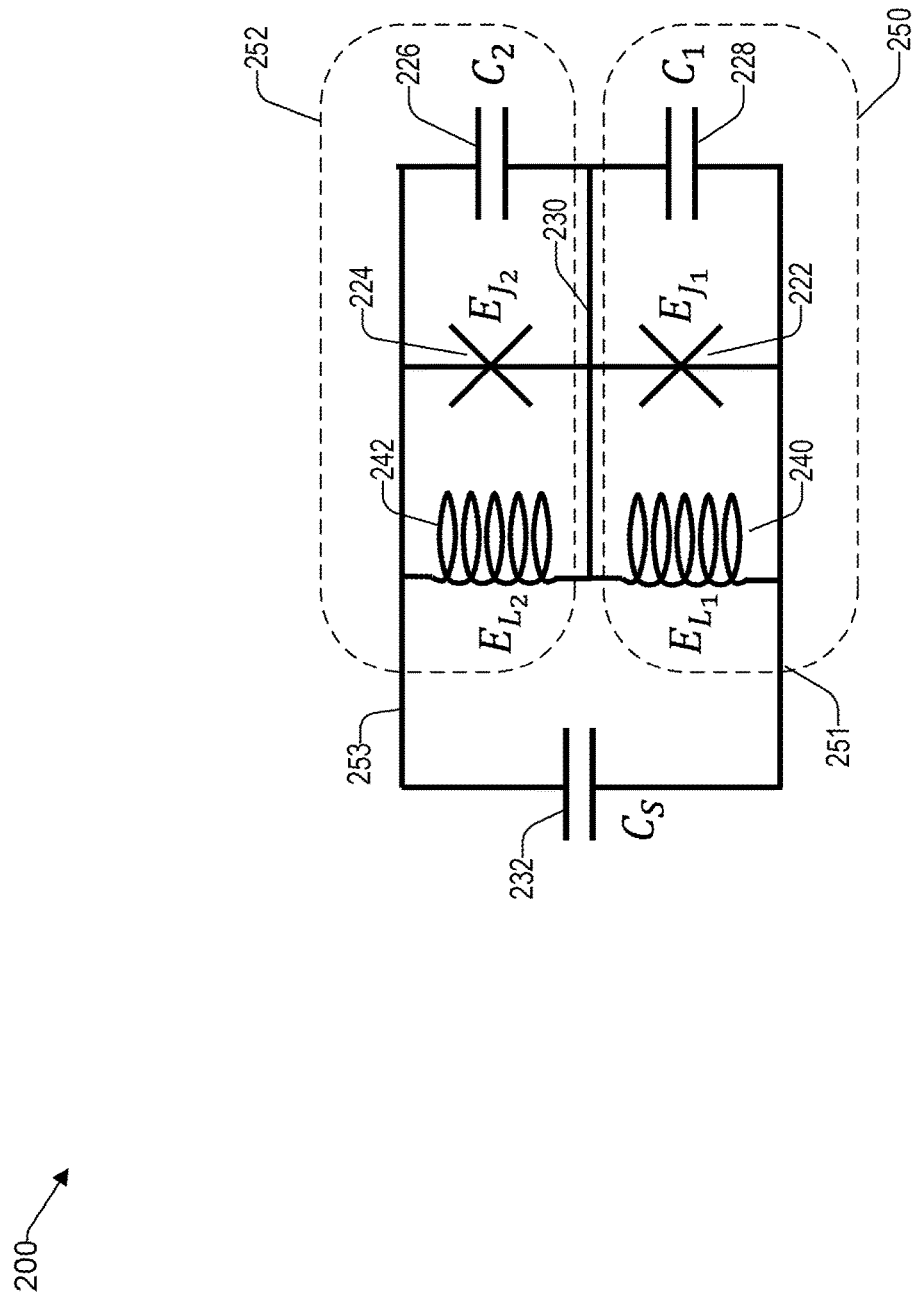
FIG. 2 is an example difluxonium circuit, consistent with an illustrative embodiment.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In discussing the present technology, it may be helpful to describe various salient terms. As used herein a qubit represents a quantum bit and a quantum gate is an operation performed on a qubit, such as controlling the super-positioning between two qubits.

As used herein, an entangling gate is an operation in which external fields (e.g., microwave pulses) are applied to a quantum processor to create an entangled state between two or more separate qubits. The term C-phase relates to a controlled phase gate, where a Z rotation of one qubit is defined by the state of another qubit. A C-phase gate is an entangling gate in which one qubit acquires a phase-shift if and only if both qubits are in their first excited state.

As used herein, a resonator-induced phase (RIP) gate is a multi-qubit entangling gate. It allows a high degree of flexibility in qubit frequencies, making it appropriate for quantum operations in large-scale architectures. An advantage of the RIP gate is its ability to couple qubits even if they are substantially detuned from each other. Accordingly, a RIP gate can overcome challenges due to constraints on the frequency arrangements of the qubits that may hinder scalability towards larger quantum architectures. The RIP gate is a controlled-Z (CZ) gate that uses the strong coupling between qubits and a resonator in a quantum system. It can be realized by applying a detuned pulsed microwave drive to a shared bus cavity, sometimes referred to herein as a bus resonator.

As used herein, a ZZ refers to a state dependent qubit interaction that can be used to form a C-phase gate. For example, a ZZ interaction is a type of interaction between two qubits or modes, in which the excitation of one qubit or mode causes a shift in the transition frequency of the other qubit or mode. Thus, it represents a way to entangle two different qubits and create a C-phase gate, because a state-dependent shift in qubit frequency can be made equivalent to a state-dependent phase-shift. A static ZZ interaction relates to an interaction that is present between two qubits or modes in the absence of any external microwave drives. This "always-on" interaction can be detrimental to a system of qubits by inhibiting independent control of each qubit and by creating unwanted entanglement. Ideally, a static ZZ interaction of 0 is desirable when there are no applied fields.

As used herein, the term flux-tunable relates to a device whose frequency depends on magnetic flux.

As used herein, a fluxonium qubit is a qubit comprising a Josephson Junction (JJ) that is shunted by both a capacitor and a large inductance, sometimes referred to a superinductor. In this regard, FIG. 1A illustrates an example circuit diagram of a fluxonium qubit. The fluxonium qubit 100 includes a JJ 106 having Josephson energy $E_J$, that is shunted by a capacitor 108 and a large inductor 110 having an inductance energy $E_L$.

A multi-mode qubit relates to any quantum system that includes strongly interacting, anharmonic oscillators. The composite system is characterized by multiple modes of excitations that have strong longitudinal couplings amongst themselves (i.e., the excitation of one mode can strongly shift the transition frequency of another). For example, such system may be a tunable-coupling qubit (TCQ). In this regard, reference is made to FIG. 1B, which provides an example circuit diagram 120 of a TCQ. The TCQ 120 includes a first Josephson Junction 122 (denoted as $E_{J1}$ in FIG. 1B) coupled to a second Josephson Junction 124 (denoted as $E_{J2}$ in FIG. 1B). In this example embodiment, first Josephson Junction 122 and/or second Josephson Junction 124 can comprise one or more superconducting films (e.g., superconducting metal film(s)) and/or one or more non-superconducting films (e.g., normal metal film(s)) formed on a substrate (e.g., a silicon (Si) substrate, etc.).

As illustrated in the example embodiment depicted in FIG. 1B, each Josephson Junction has a corresponding capacitance coupled in parallel, depicted as a first Capacitor $C_1$ (128) and a second capacitor $C_2$ (126), respectively. In the example embodiment illustrated in FIG. 1B, first capacitor 128 and second capacitor 126 represent the direct capacitive shunting across first Josephson Junction 122 and second Josephson Junction 124, respectively. In this regard, FIG. 1C illustrates an example capacitor design 140 representing the first capacitor 128 and the second capacitor 126 of FIG. 1, consistent with an illustrative embodiment. For example, the capacitor design 140 can be implemented by superconducting pads 130A, 130B, and 130C connected by Josephson Junctions 132 and 134.

The TCQ 120 has two distinct modes corresponding to symmetric and antisymmetric combinations of excitations associated with its two junctions 122 and 124. In this regard, reference is made to FIG. 1D, which illustrates an example mode structure of a TCQ, consistent with an illustrative embodiment. The B mode is higher in frequency than the A mode, sometimes referred to herein as the dark mode. The A mode does have a net dipole moment and is generally lower in frequency than the B mode, sometimes referred to herein as the bright mode.

For example, in various instances, a two-junction qubit can support and/or exhibit two distinct excitation modes: a dark mode and a bright mode. These two distinct excitation modes can have two different spatial symmetries and/or two different transition frequencies (e.g., a dark mode transition frequency and a bright transition frequency). More specifically, the dark mode of a two-junction qubit can be a higher frequency excitation mode that has no net dipole moment. Stated differently, the dark mode can refrain from coupling to global electric fields. In contrast, the bright mode of a two-junction qubit can be a lower frequency excitation mode that has a net dipole moment. That is, the bright mode can couple to global electric fields. In various instances, a two-junction qubit can be encoded in either the dark mode (e.g., and can thus have a dark mode transition frequency) or the bright mode (e.g., and can thus have a bright mode transition frequency).

In various aspects, short microwave pulses can be used to switch a two-junction qubit between encodings (e.g., a suitable microwave pulse can be applied to a two-junction qubit to switch the two-junction qubit from the dark mode to the bright mode and/or from the bright mode to the dark mode).

For example, the superconducting qubit 134 and second superconducting qubit 132 illustrated in the example embodiment depicted in FIG. 1C can each operate in a first oscillating mode (e.g., A or bright mode) and a second oscillating mode (e.g., B or dark mode). In some embodiments, the first oscillating mode and the second oscillating mode can correspond to different (e.g., distinct) frequencies and/or different (e.g., distinct) spatial symmetries with respect to one another. In these embodiments, the first oscillating mode and the second oscillating mode can be indicative of symmetric and antisymmetric combinations of excitations associated with: first Josephson Junction 122 and second Josephson Junction 124. In these embodiments, such symmetric and antisymmetric combinations of excitations associated with first Josephson Junction 122 and second Josephson Junction 124 can result from a capacitive coupling of first superconducting pad 130C and third superconducting pad 130A.

As used herein, a transmon is type of superconducting qubit, in which the charging energy Ec is much smaller than the Josephson energy Ej.

As used herein, a driveline relates to a qubit control line that carries signals to the qubit.

As used herein, the terms "coupled" and/or "electrically coupled" are not meant to mean that the elements must be directly coupled together—intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

As used herein, certain terms are used indicating what may be considered an idealized behavior, such as "lossless," "superconductor," "superconducting," "absolute zero," which are intended to cover functionality that may not be exactly ideal but is within acceptable margins for a given application. For example, a certain level of loss or tolerance may be acceptable such that the resulting materials and structures may still be referred to by these "idealized" terms.

Although the terms first, second, third, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

The present disclosure generally relates to superconducting devices, and more particularly, to providing a quantum computing architecture with low cross-talk between qubits and that permits fast and accurate two-qubit entangling gates. The electromagnetic energy associated with a qubit can be stored in so-called Josephson Junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are used to block or reduce the noise and improve the signal-to-noise ratio. Alternatively, or in addition, a microwave signal (e.g., pulse) can be used to entangle one or more qubits. The amplitude and/or phase of the returned/output microwave signal carries information about the qubit state, such as whether the qubit has dephased to the ground or excited state. The microwave signal carrying the quantum information about the qubit state is usually weak (e.g., on the order of a few microwave photons), and may be affected by cross-talk.

The ability to include more qubits is salient to being able to realize the potential of scalable quantum computers. Cross-talk between qubits can increase the error rate. In general, there are two main sources of gate errors, namely decoherence (stochastic) and non-ideal interactions (deterministic). The latter includes parasitic coupling, leakage to non-computational states, and control crosstalk.

The inventor has recognized that to increase the computational power and reliability of a quantum computer, improvements are needed along two main dimensions. First, is the qubit count itself. The more qubits in a quantum processor, the more states can in principle be manipulated and stored. Second is low error rates, which is relevant to manipulate qubit states accurately and perform sequential operations that provide consistent results and not merely unreliable data. Thus, to improve fault tolerance of a quantum computer, a large number of physical qubits should be used to store a logical quantum bit. In this way, the local information is delocalized such that the quantum computer is less susceptible to local errors and the performance of measurements in the qubits' eigenbasis, similar to parity checks of classical computers, thereby advancing to a more fault tolerant quantum bit.

In recent years, there is an active interest in using fluxonium qubits due to their high anharmonicity and high coherence times. However, similar to other superconducting qubits, realizing high fidelity two-qubit gates with minimal cross-talk between fluxonium qubits has been an open challenge. Although cross-talk between superconducting qubits can be controlled by making use of mode-selective coupling between TCQs, such TCQs tend to have lower anharmonicity than other superconducting qubits, which can limit the speed, and thus, fidelity of quantum gates.

In one aspect, the teachings herein are based on the inventor's insight that directly applying conventional integrated circuit techniques for interacting with computing elements to superconducting quantum circuits may not be effective because of the unique challenges presented by quantum circuits that are not presented in classical computing architectures. Accordingly, embodiments of the present disclosure are further based on recognition that issues unique to quantum circuits have been taken into consideration when evaluating applicability of conventional integrated circuit techniques to building superconducting quantum circuits, and, in particular, to electing methods and architectures used for interacting efficiently with qubits.

The teachings herein provide a quantum computing architecture with low cross-talk between qubits and that permits fast and accurate two-qubit entangling gates. The architecture is substantially insensitive to moderate variations in qubit frequency due to imperfectly controlled device parameters (e.g., Josephson Junction size). The anharmonicity of the qubits is maximized, thereby allowing the single and two-qubit gates to be as fast as possible. The techniques described herein may be implemented in a number of ways. Example implementations are provided below with reference to the following figures.

Example Circuit Diagrams

FIG. 2 illustrates a difluxonium circuit 200, consistent with an illustrative embodiment. The circuit comprises a first fluxonium qubit 250 having a first Josephson Junction 222 ($E_{J1}$) in parallel with a first capacitor 228 ($C_1$) and a first superconducting inductor 240 ($E_{L1}$). There is a second fluxonium qubit 252 having a second Josephson Junction 224 ($E_{J2}$) in parallel with a second capacitor 226 ($C_2$) and a second superconducting inductor 242 ($E_{L2}$). The first and second fluxonium qubits 250, 252 are connected in series and share a common node 230. In one embodiment, the common node 230 is a superconducting capacitor pad, sometimes referred to herein as the middle pad. The first node 251 of first fluxonium qubit, and the first node 253 of the second fluxonium qubit, are superconducting capacitor pads, sometimes referred to herein as bottom pad and top pad, respectively. The top and bottom pads 253 and 251 are capacitively coupled by a third capacitor $C_S$ 232. Such capacitive coupling (i.e., between the bottom 252 and top 250 capacitor pads) causes plasmon-like excitations associated with the two fluxonium qubits to hybridize into first and second modes (e.g., A and B), similar to having two TCQs.

For example, the third capacitor 232 represents the capacitive coupling between first pad 252 and the second pad 250, where such capacitive coupling can enable creation of the first oscillating mode and the second oscillating mode having different frequencies and different spatial symmetries relative to one another. In this example embodiment, such interaction between the first oscillating mode and the second oscillating mode can enable creation of extended states (e.g., hybridized quantum states, hybridized oscillating modes, etc.) of first and second fluxonium qubits.

Accordingly, the architecture of the circuit 200 provides two fluxonium qubits 250 and 252 that are connected in series and includes additional capacitive coupling 232. The architecture of this difluxonium generates a novel multimode qubit with high anharmonicity (relative to the anharmonicity of conventional transmon qubits), as well as a high coherence of fluxonium (relative to the coherence times of conventional transmon qubits).

In one embodiment, selective charge coupling is used to just one mode of the difluxonium. This allows us to suppress cross-talk between the qubit modes (i.e., those modes that are not coupled), but still allow two-qubit gates.

In one embodiment, the difluxonium circuit 200 is operated at zero magnetic field, as provided by the expression below:

$$(\phi_{ext,1} = \phi_{ext,2} = 0) \tag{Eq. 1}$$

The device can be magnetically shielded, to prevent dephasing by flux noise. In this regard, it is noted that operating a superconducting quantum computer without the need for external magnetic fields allows the suppression of the influence of magnetic flux noise, which can dephase qubits and decrease gate fidelity. The Hamiltonian of the difluxonium qubit circuit 200 is provided by the expression below:

$$H = 4E_{C_1}(n_1)^2 + \frac{1}{2}E_{L_1}(\phi_1)^2 - E_{J_1}\cos(\phi_1 - \phi_{ext,1}) + \\ 4E_{C_2}(n_2)^2 + \frac{1}{2}E_{L_2}(\phi_2)^2 - E_{J_2}\cos(\phi_2 - \phi_{ext,2}) + E_{C_S}n_1 n_2 \tag{Eq. 2}$$

Where:

n1 represents the charge operator for the first Josephson junction;

n2 represents the charge operator for the second Josephson junction; and $E_{C_s}$ represents the coupling energy between n1 and n2 (defined below in Eq. 5).

The passive energies of the different capacitive elements $C_1$, $C_2$, and $C_S$ (i.e., 228, 226 and 232) are provided by the equations below:

$$E_{C_1} = \frac{e^2(C_S + C_2)}{2[C_1 C_2 + C_S(C_1 + C_2)]} \quad \text{(Eq. 3)}$$

$$E_{C_2} = \frac{e^2(C_S + C_1)}{2[C_1 C_2 + C_S(C_1 + C_2)]} \quad \text{(Eq. 4)}$$

$$E_{C_S} = \frac{8e^2 C_S}{[C_1 C_2 + C_S(C_1 + C_2)]} \quad \text{(Eq. 5)}$$

Figure 3:
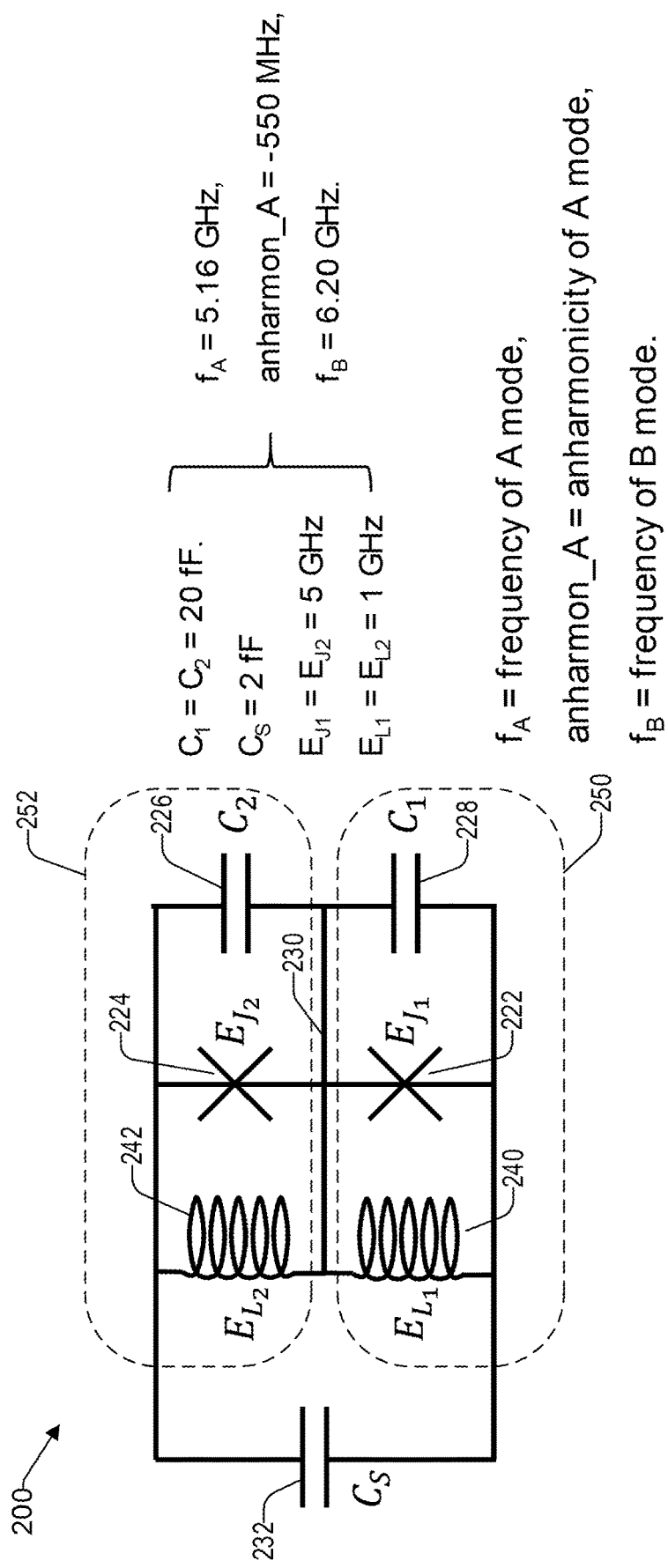
FIG. 3 provides some example device parameters of the difluxonium qubit circuit of FIG. 2, consistent with an illustrative embodiment.

FIG. 3 provides some example device parameters of the difluxonium qubit circuit 200 of FIG. 2, consistent with an illustrative embodiment. More specifically, FIG. 3 provides example values for the first capacitor $C_1$ (228), the second capacitor $C_2$ (226), the shunt capacitor $C_S$ (232), the energy of the first and second Josephson Junctions $E_{J1}$, $E_{J2}$ (222, 224), and the energy of the first and second inductors $E_{L1}$, $E_{L1}$ (240, 242). In the example of FIG. 3, the frequency of the A mode is 5.16 GHz, having an anharmonicity of −550 MHz. The frequency of the B mode is 6.20 GHz.

Figure 4:
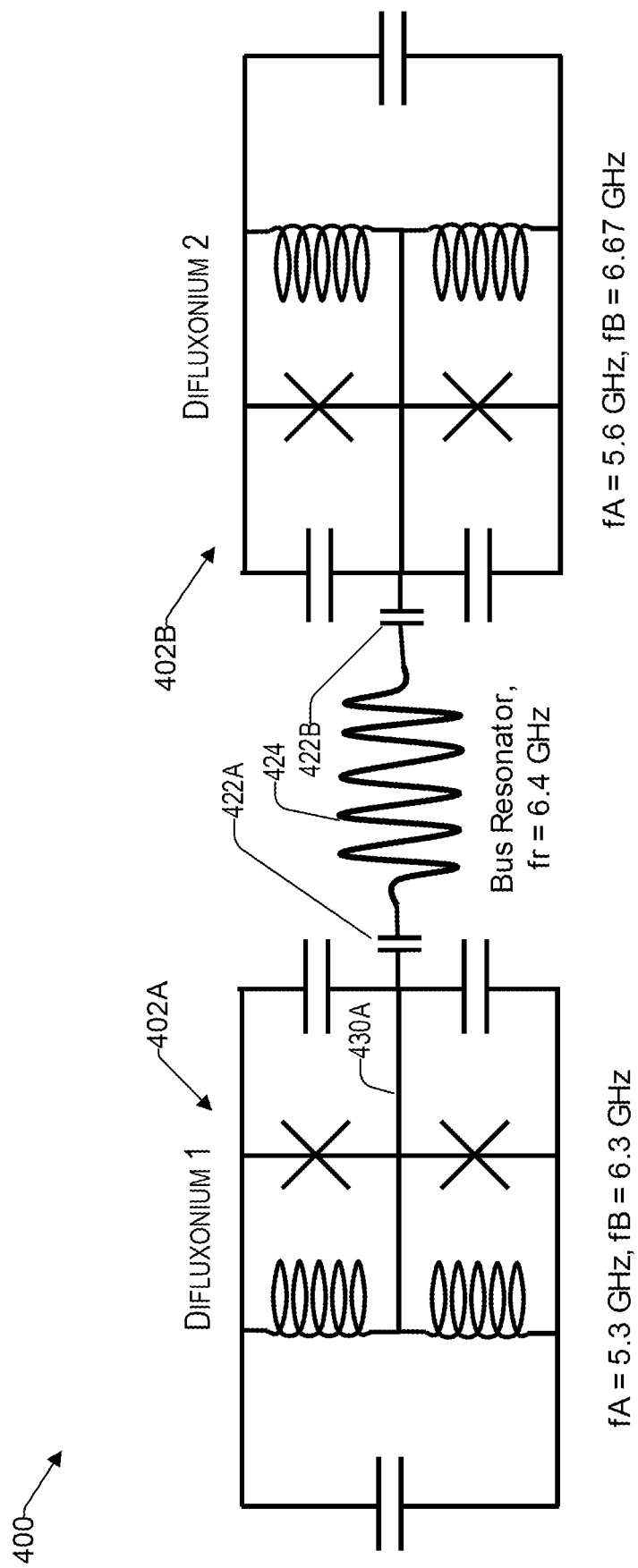
FIG. 4 is an example circuit of a bus resonator with mode-selective coupling to two difluxonium qubits, consistent with an illustrative embodiment.

Reference now is made to FIG. 4, which is circuit 400 of a bus resonator with mode-selective coupling to two difluxonium qubits, consistent with an illustrative embodiment. The circuit 400 depicts that two difluxonium circuits 200 of FIG. 2 can be connected together by way of a bus resonator 424. In the example embodiment illustrated in FIG. 4, the middle pad 430A of the first difluxonium qubit 402A can be capacitively coupled to the superconducting bus resonator 424, represented by coupling capacitor 422A. Similarly, the middle pad 430B of the second difluxonium qubit 402B can be capacitively coupled to the superconducting bus resonator 424, represented by coupling capacitor 422B.

In some embodiments, the first and second difluxonium qubits 402A and 402B may encode qubit information in the same mode (e.g., bright or dark), while a bus resonator is coupled to the opposite mode (e.g., dark or bright). For example, the first difluxonium qubit 402A may be in a first mode (e.g., mode A or bright) while the second difluxonium qubit 402B is in a first mode (e.g., mode A or bright) and while the bus resonator is coupled to the second modes of the two difluxonium qubits (e.g., their B modes or dark modes), or in reverse.

For example, the superconducting bus resonator 424 can be coupled to first difluxonium qubit 402A and second difluxonium qubit 402B based on (e.g., in accordance with) first difluxonium qubit 402A corresponding to mode B of FIG. 1D, which can comprise a coupling mode. In this embodiment, the second difluxonium qubit 402B can enable encoding and/or storing quantum information (e.g., qubit information, quantum state information, etc.) in the A mode of the first difluxonium qubit 402A and the second difluxonium qubit 402B, where the mode A of FIG. 1D can comprise a data mode. The mode-selective coupling discussed herein facilitates two-qubit entangling gates while suppressing cross-talk between qubit modes. Such mode coupling schemes described in the above embodiments can constitute mode-selective coupling schemes that can be realized by an entity (e.g., a human, a computing device, a software application, an agent, a machine learning model, an artificial intelligence model, etc.) that implements one or more of the embodiments of the subject disclosure described herein.

In the example embodiment of FIG. 4, for the first difluxonium qubit 402A, the parameters of the first and second difluxonium qubits 402A and 402B were selected such that the frequency of the A mode $f_A$ is 5.3 GHz and the frequency of the B mode $f_B$ is 6.3 GHz. For the second difluxonium qubit 402B, the frequency of the A mode is $f_A$=5.6 GHz and the frequency of the B mode $f_B$ is 6.67 GHz. Using the Hamiltonian discussed hereinabove, the ZZ between Difluxonium A modes is a very small 0.07 kHz, which is substantially less than, for example, known transmon devices. For example, the excitation of the second difluxonium qubit in A mode would practically not affect the transition frequency of the first difluxonium qubit.

The ZZ coupling between the first difluxonium qubit 402A A mode and the bus resonator 424, is large (e.g., 14 MHz); and the ZZ coupling between the second difluxonium qubit 402B A mode and the bus resonator 424 is also large at 4.4 MHz.

Accordingly, there is a 10% asymmetry among $E_J$'s and $E_L$'s for a given fluxonium qubit. The bus resonator 424 has ~46 MHz exchange coupling to B modes of the difluxonium qubits. As illustrated in FIG. 4, the static ZZ between the A modes of the difluxonium qubits 402A and 402B is small, demonstrating low cross-talk. In this regard it is noted that a large static ZZ between each A mode and the bus resonator 424 indicates that there is large longitudinal coupling between the qubit modes and the bus resonator 424. This coupling allows a two-qubit gate to be implemented by a RIP gate (e.g., driving the bus resonator 424 detuned). For example, in this embodiment, based on driving the superconducting bus resonator 424 detuned, device 400 and/or superconducting bus resonator 424 can operate as a RIP gate, which can generate ZZ interactions between the first difluxonium qubit 402A and the second difluxonium qubit 402B that are present when there is a microwave drive (e.g., microwave pulse, microwave signal, control signal, etc.) at superconducting bus resonator 424 (e.g., when there is a microwave signal applied to superconducting bus resonator 424).

Example Process

Figure 5:
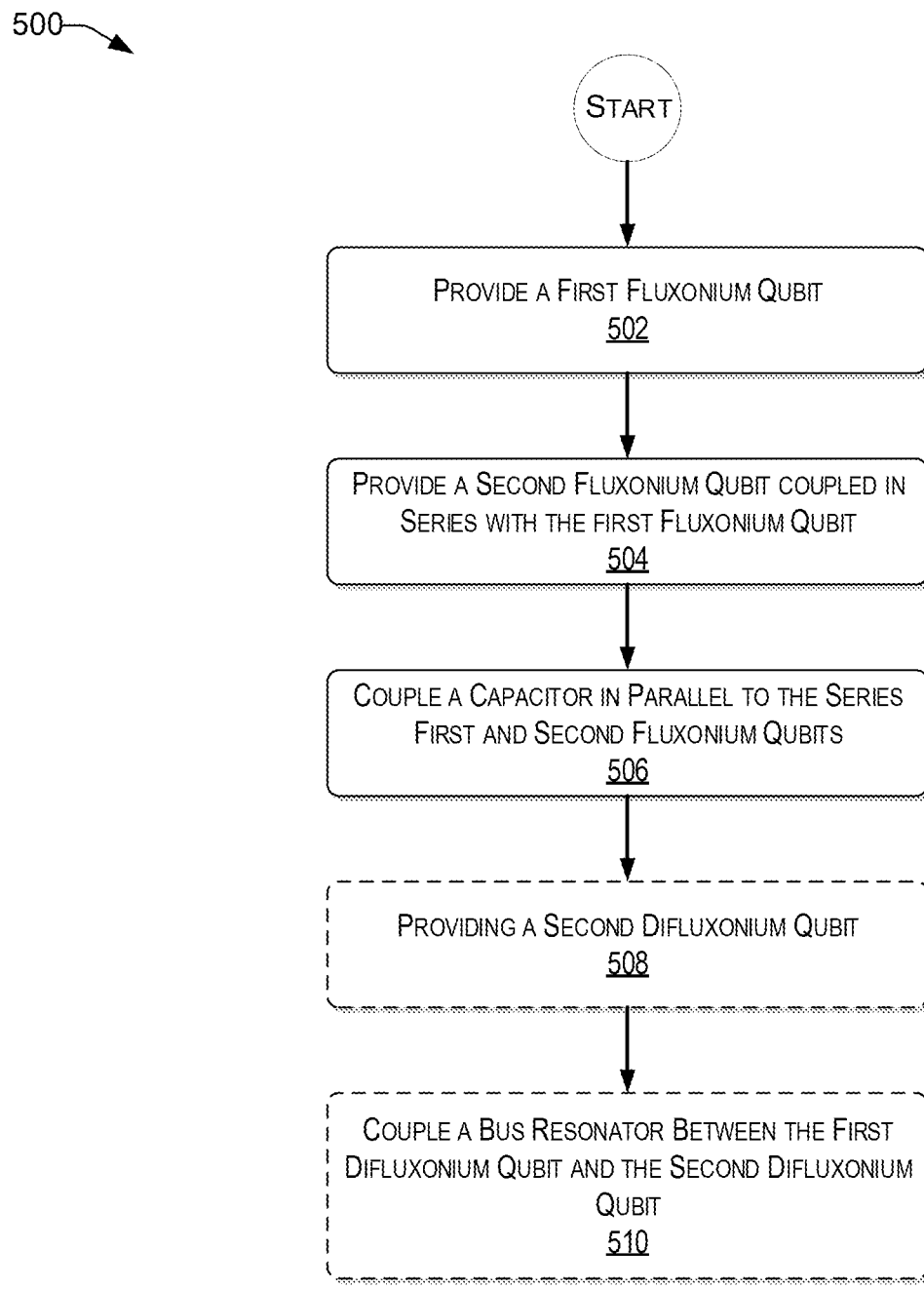
FIG. 5 presents an illustrative flow diagram of an example, non-limiting process of providing mode selective charge coupling in multi-qubit architectures in accordance with one or more embodiments described herein.

With the foregoing overview of the example architectures 200, 300, and 400, it may be helpful now to consider a high-level discussion of an example process. To that end, FIG. 5 presents an illustrative flow diagram of an example, non-limiting process 500 of providing mode selective charge coupling in multi-qubit architectures in accordance with one or more embodiments described herein. Process 500 is illustrated as a collection of blocks in a logical flowchart, which represents sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform functions or implement abstract data types. In each process, the order in which the operations are described is not intended to be construed as a limitation, and any number of the described blocks can be combined in any order and/or performed in parallel to implement the process. For discussion purposes, the process 500 is described with reference to the architecture of FIGS. 2 and 4.

At block 502, a first fluxonium qubit 250 is provided comprising a first Josephson Junction (JJ) 222 in parallel with a first capacitor 228 and a first superconducting inductor 240.

At block 504, a second fluxonium qubit 252 is provided comprising a second JJ 224 in parallel with a second capacitor 226 and a second superconducting inductor 242, coupled in series with the first fluxonium qubit 250.

At block 506, a third capacitor 232 is coupled in parallel to the series' first and second fluxonium qubits 250, 252.

In one embodiment, the first fluxonium qubit, the second fluxonium qubit, and the third capacitor create a first difluxonium qubit 402A. At block 508 a second difluxonium qubit 402B is provided.

At block 510, a bus resonator 424 is coupled between the first difluxonium qubit and the second difluxonium qubit.

Example Computer Platform

Figure 6:
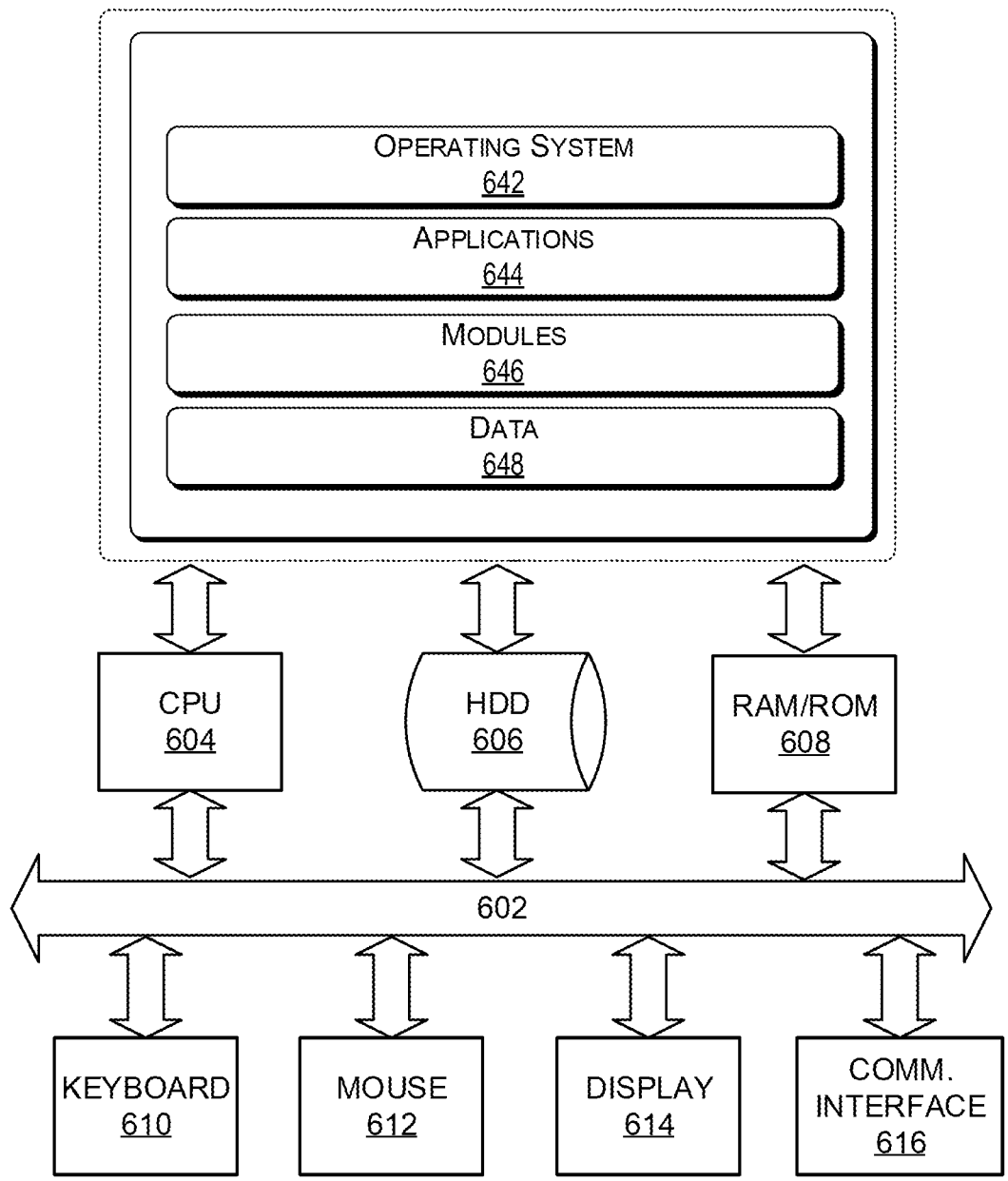
FIG. 6 provides an example, non-limiting operating environment in which one or more embodiments described herein can be facilitated.

In one embodiment, functions relating to providing mode selective charge coupling in multi-qubit architectures in accordance with one or more embodiments described herein, can be performed at least in part with the use of one or more computing devices. FIG. 6 provides an example, non-limiting operating environment 600 in which one or more embodiments described herein can be facilitated. While aspects of the embodiments have been described above in the general context of computer-executable instructions that can run on one or more computers, those skilled in the art will recognize that the embodiments can be also implemented in combination with other program modules and/or as a combination of hardware and software.

The operating environment 600 may include a central processing unit (CPU) 604, a hard disk drive (HDD) 606, random access memory (RAM) and/or read only memory (ROM) 608, a keyboard 610, a mouse 612, a display 614, and a communication interface 616, which are connected to a system bus 602.

In one embodiment, a number of program modules can be stored in the memory 606, 608, and/or CPU 604, including an operating system 642, one or more application programs 644, other program modules 646, and program data. 648.

While modules 642 to 648 and various functions described herein are illustrated in FIG. 6 to be part of the CPU 604, HDD 606, and/or RAM/ROM 608, in some embodiments, one or more of these modules may be implemented in the hardware of the computing device 600. For example, the modules discussed herein may be implemented in the form of partial hardware and partial software. That is, one or more of the components of the Memory address translation unit 640 shown in FIG. 6 may be implemented in the form of electronic circuits with transistor(s), diode(s), capacitor(s), resistor(s), inductor(s), varactor(s) and/or memristor(s). In other words, the modules 646 be implemented with one or more specially-designed electronic circuits performing specific tasks and functions described herein.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A qubit structure comprising:
   a first fluxonium qubit comprising a first Josephson Junction (JJ) in parallel with a first capacitor and a first superconducting inductor;
   a second fluxonium qubit comprising a second JJ in parallel with a second capacitor and a second superconducting inductor, coupled in series with the first fluxonium qubit; and
   a third capacitor coupled in parallel to the series first and second fluxonium qubits.

2. The qubit structure of claim 1, wherein:
   the first and second capacitors are each superconductor capacitor pads;
   a common node at the interface of the series connection between the first fluxonium qubit and the second fluxonium qubit is a middle superconductor capacitor pad; and
   the first and second capacitor pads are capacitively coupled by the third capacitor.

3. The qubit structure of claim 2, wherein the capacitive coupling of the third capacitor is configured to cause plasmon-like excitations associated with the first and second fluxonium qubits to hybridize into a bright mode and a dark mode.

4. The qubit structure of claim 3, wherein the dark mode is higher in frequency than the bright mode.

5. The qubit structure of claim 1, wherein:
   the first fluxonium qubit, the second fluxonium qubit, and the third capacitor create a first difluxonium qubit; and
   the qubit structure further comprises:
     a second difluxonium qubit; and
     a bus resonator coupled between the first difluxonium qubit and the second difluxonium qubit.

6. The qubit structure of claim 5, wherein:
   the bus resonator has a first node that is capacitively coupled to a middle pad of the first difluxonium qubit; and
   the bus resonator has a second node that is capacitively coupled to a middle pad of the second difluxonium qubit.

7. The qubit structure of claim 5, wherein the bus resonator structure is configured to provide a mode-selective charge coupling to suppress cross-talk between qubit modes that are not coupled.

8. The qubit structure of claim 5, wherein the first fluxonium qubit and the second fluxonium qubit is implemented by a resonator induced phase (RIP) gate.

9. The qubit structure of claim 5, wherein the first fluxonium qubit and the second fluxonium qubit are in separate modes.

10. The qubit structure of claim 1, wherein the first and second fluxonium qubits are configured to operate at a zero magnetic field.

11. The qubit structure of claim 1, further comprising a magnetic shield configured to prevent dephasing by a flux noise of the first and second fluxonium qubits.

12. A method of providing a multi-qubit entangling gate, comprising:
   providing a first fluxonium qubit comprising a first Josephson Junction (JJ) in parallel with a first capacitor and a first superconducting inductor;
   providing a second fluxonium qubit comprising a second JJ in parallel with a second capacitor and a second superconducting inductor, coupled in series with the first fluxonium qubit; and
   coupling a third capacitor in parallel to the series' first and second fluxonium qubits.

13. The method of claim 12, further comprising:
   capacitively coupling the first and second capacitor pads by the third capacitor;
   configuring a common node at the interface of the series connection between the first fluxonium qubit and the second fluxonium qubit as a middle superconductor capacitor pad; and
   configuring the first and second capacitors each as superconductor capacitor pads.

14. The method of claim 13, further comprising causing plasmon-like excitations associated with the first and second fluxonium qubits to hybridize into a bright mode and a dark mode, by the capacitive coupling.

15. The method of claim 12:
   wherein the first fluxonium qubit, the second fluxonium qubit, and the third capacitor create a first difluxonium qubit; and
   the method further comprising:
     providing a second difluxonium qubit; and
     coupling a bus resonator between the first difluxonium qubit and the second difluxonium qubit.

16. The method of claim 15, further comprising:
   capacitively coupling a first node of the bus resonator to a middle pad of the first difluxonium qubit; and
   capacitively coupling a second node of the bus resonator to a middle pad of the second difluxonium qubit.

17. The method of claim 15, further comprising providing a mode-selective charge coupling to suppress cross-talk between qubit modes that are not coupled, by the bus resonator.

18. The method of claim 15, further comprising operating the first fluxonium qubit and the second fluxonium qubit in separate modes.

19. The method of claim 12, further comprising prevent dephasing by a flux noise of the first and second fluxonium qubits via a magnetic shield.

20. A resonator induced phase (RIP) gate comprising:
   a first difluxonium qubit, comprising:
     a first fluxonium qubit comprising a first Josephson Junction (JJ) in parallel with a first capacitor and a first superconducting inductor;
     a second fluxonium qubit comprising a second JJ in parallel with a second capacitor and a second superconducting inductor, coupled in series with the first fluxonium qubit; and
     a third capacitor coupled in parallel to the series first and second fluxonium qubits;
   a second difluxonium qubit, comprising;
     a third fluxonium qubit comprising a third Josephson Junction (JJ) in parallel with a fourth capacitor and a third superconducting inductor;

a fourth fluxonium qubit comprising a fourth JJ in parallel with a fifth capacitor and a fourth superconducting inductor, coupled in series with the third fluxonium qubit; and a sixth capacitor coupled in parallel to the series third and fourth fluxonium qubits; and a bus resonator coupled between the first difluxonium qubit and the second difluxonium qubit.

* * * * *